(12) United States Patent
Chiang

(10) Patent No.: US 7,238,566 B2
(45) Date of Patent: Jul. 3, 2007

(54) METHOD OF FORMING ONE-TRANSISTOR MEMORY CELL AND STRUCTURE FORMED THEREBY

(75) Inventor: Min-Hsiung Chiang, Banciao (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 35 days.

(21) Appl. No.: 10/681,643

(22) Filed: Oct. 8, 2003

(65) Prior Publication Data

US 2005/0077557 A1 Apr. 14, 2005

(51) Int. Cl.
H01L 21/8242 (2006.01)

(52) U.S. Cl. .............. 438/239; 438/240; 438/243; 438/244; 438/253; 438/386; 438/396

(58) Field of Classification Search ............. 438/210, 438/239, 240, 243, 244, 386, 387, FOR. 220, 438/FOR. 430, 253, 396
See application file for complete search history.

(56) References Cited

U.S. PATENT DOCUMENTS

| 4,329,704 | A | | 5/1982 | Sakurai et al. | |
|---|---|---|---|---|---|
| 5,150,276 | A | * | 9/1992 | Gonzalez et al. | 361/313 |
| 5,501,999 | A | * | 3/1996 | Park | 438/253 |
| 5,521,111 | A | * | 5/1996 | Sato | 438/244 |
| 5,665,624 | A | * | 9/1997 | Hong | 438/244 |
| 6,048,738 | A | | 4/2000 | Hsu et al. | |
| 6,075,720 | A | | 6/2000 | Leung et al. | |
| 6,081,008 | A | * | 6/2000 | Rostoker | 257/303 |
| 6,130,470 | A | | 10/2000 | Selcuk | |
| 6,284,590 | B1 | * | 9/2001 | Cha et al. | 438/240 |
| 6,335,895 | B1 | | 1/2002 | Sugibayashi | |
| 6,352,898 | B2 | * | 3/2002 | Yang et al. | 438/298 |
| 6,420,226 | B1 | | 7/2002 | Chen et al. | |
| 6,436,762 | B1 | * | 8/2002 | Tzeng et al. | 438/253 |
| 6,720,600 | B2 | * | 4/2004 | Okita | 257/295 |
| 2001/0021122 | A1 | * | 9/2001 | Kurth et al. | 365/149 |
| 2001/0024854 | A1 | * | 9/2001 | Takeuchi et al. | 438/253 |
| 2002/0030211 | A1 | * | 3/2002 | Keeth et al. | 257/296 |
| 2002/0094697 | A1 | | 7/2002 | Leung et al. | |
| 2003/0042519 | A1 | * | 3/2003 | Tzeng et al. | 257/296 |
| 2003/0116795 | A1 | * | 6/2003 | Joo | 257/296 |
| 2003/0214872 | A1 | * | 11/2003 | Tu | 365/225 |
| 2003/0234416 | A1 | * | 12/2003 | Thomas et al. | 257/306 |
| 2004/0090734 | A1 | * | 5/2004 | Lian | 361/306.3 |
| 2004/0191985 | A1 | * | 9/2004 | Tu | 438/244 |

* cited by examiner

*Primary Examiner*—George R. Fourson
*Assistant Examiner*—Joannie Adelle Garcia
(74) *Attorney, Agent, or Firm*—Duane Morris LLP

(57) ABSTRACT

A method of forming a one-transistor memory cell includes the steps of: forming a dielectric layer over a substrate having a pass-gate formed thereon; forming an opening in the dielectric layer to expose a portion of the substrate at least adjacent to the pass-gate; forming a capacitor dielectric layer on sidewalls of the opening in the dielectric layer and on the exposed portion of the substrate; and forming an electrode layer over the capacitor dielectric layer. A one-transistor memory cell is also disclosed. The one-transistor memory cell has a substrate having a pass-gate formed thereover. A dielectric layer is formed over the pass-gate and the substrate and has an opening exposing a portion of the substrate adjacent to the pass-gate. A capacitor dielectric layer is formed on sidewalls of the opening and on the exposed portion of the substrate. An electrode layer is formed on the capacitor dielectric layer.

37 Claims, 5 Drawing Sheets

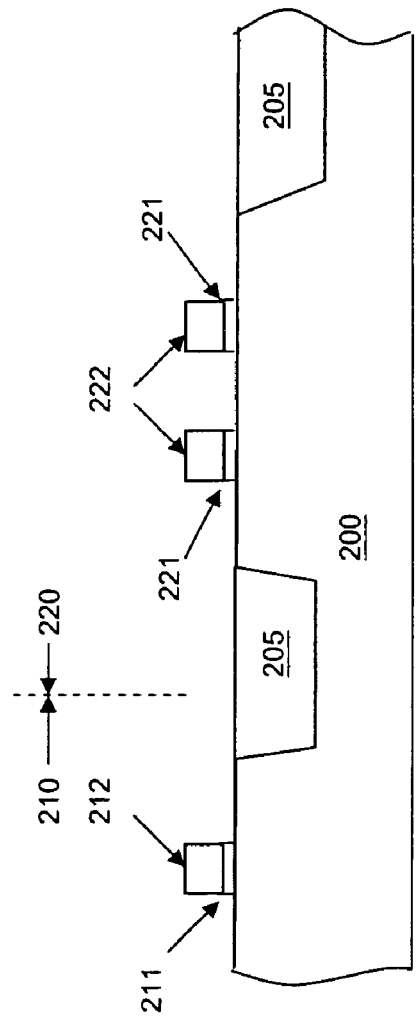
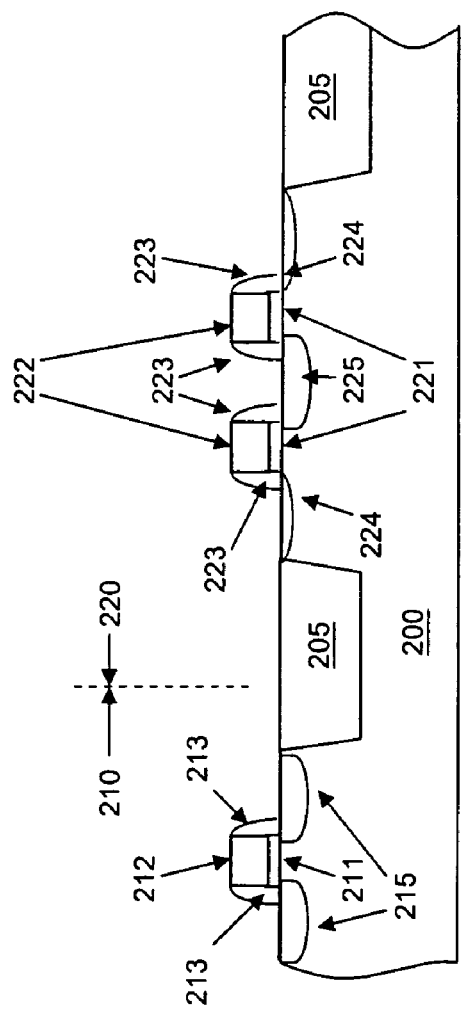

METHOD OF FORMING ONE-TRANSISTOR MEMORY CELL AND STRUCTURE FORMED THEREBY

FIELD OF THE INVENTION

The present invention relates to methods for fabricating semiconductor memory cells and structures formed thereby; more particularly, the present invention relates to methods for forming a one-transistor cell and a structure formed thereby.

DESCRIPTION OF THE RELATED ART

In dynamic random access memory (DRAM), the DRAM array is predominantly comprised of one-transistor memory cells that each includes a selection transistor and a storage capacitor. The selection transistor serves as a switch, and the capacitor is used for storing electric charges that represent data. For example, the terminal voltage of the capacitor determines the binary information stored therein. A high terminal voltage may represent a "1" and a low terminal voltage may represent a "0" or the opposite could be the case. A "write" operation is performed when a voltage corresponding to the binary information is applied to the memory cell. A "read" operation occurs when the existence or absence of a capacitor charge is determined by a sensing circuit that compares the current from the capacitor and a reference current, thereby providing a signal indicative of the binary state.

FIG. 1 illustrates a partial cross-sectional view of a DRAM cell in accordance with the prior art. The DRAM cell includes a substrate 100 having a shallow trench isolation (STI) structure 110 therein, a transfer gate 120 and electrode plate 130 formed over the substrate 100, and source/drain (S/D) regions 140 and 150 within the substrate 100 and adjacent to the transfer gate 120, spacers 160 and the electrode plate 130. The transfer gate 120 and the electrode plate 130 are usually formed in the same process. A gate dielectric layer 125 and a capacitor dielectric layer 135 are formed beneath the transfer gate 120 and the electrode plate 130, respectively, and are typically formed in the same process.

As mentioned above, the transfer gate 120 and the electrode plate 130 are typically formed within the same manufacturing process. Because of design rule requirements the space between the transfer gate 120 and the electrode plate 130 should be minimized when they are formed in the same photolithographic process. This space between the transfer gate 120 and the electrode plate 130 may differ in accordance with different semiconductor manufacturing technologies and generally cannot be reduced because photoresist scum can become lodged in the space during the photolithography processes used in forming the transfer gate 120 and electrode plate 130.

U.S. Pub. Pat. Application No. 2002/0094697, titled "DRAM cell having a capacitor structure fabricated partially in a cavity and method for operating same," published on Jul. 18, 2002, discloses another DRAM cell structure. The DRAM cell includes a capacitor formed within the semiconductor substrate and partially within a trench isolation.

SUMMARY OF THE INVENTION

A method of forming a one-transistor memory cell is disclosed, which includes the steps of: forming a dielectric layer over a substrate having a pass-gate formed thereon; forming an opening in the dielectric layer to expose a portion of the substrate at least adjacent to the pass-gate; forming a capacitor dielectric layer on sidewalls of the opening in the dielectric layer and on the exposed portion of the substrate; and forming an electrode layer over the capacitor dielectric layer.

A one-transistor memory cell is also disclosed. The one-transistor memory cell has a substrate having a pass-gate formed thereover. A dielectric layer is formed over the pass-gate and the substrate and has an opening exposing a portion of substrate adjacent to the pass-gate. A capacitor dielectric layer is formed on sidewalls of the opening and on the exposed portion of the substrate. An electrode layer is formed on the capacitor dielectric layer.

BRIEF DESCRIPTION OF THE DRAWINGS

The accompanying drawings illustrate preferred embodiments of the invention, as well as other information pertinent to the disclosure, in which:

FIGS. 2A–2G are a series of cross-sectional views illustrating an exemplary embodiment of a method of forming a one-transistor cell in accordance with the present invention and a one-transistor cell structure.

DESCRIPTION OF SOME EMBODIMENTS

Figure 1:
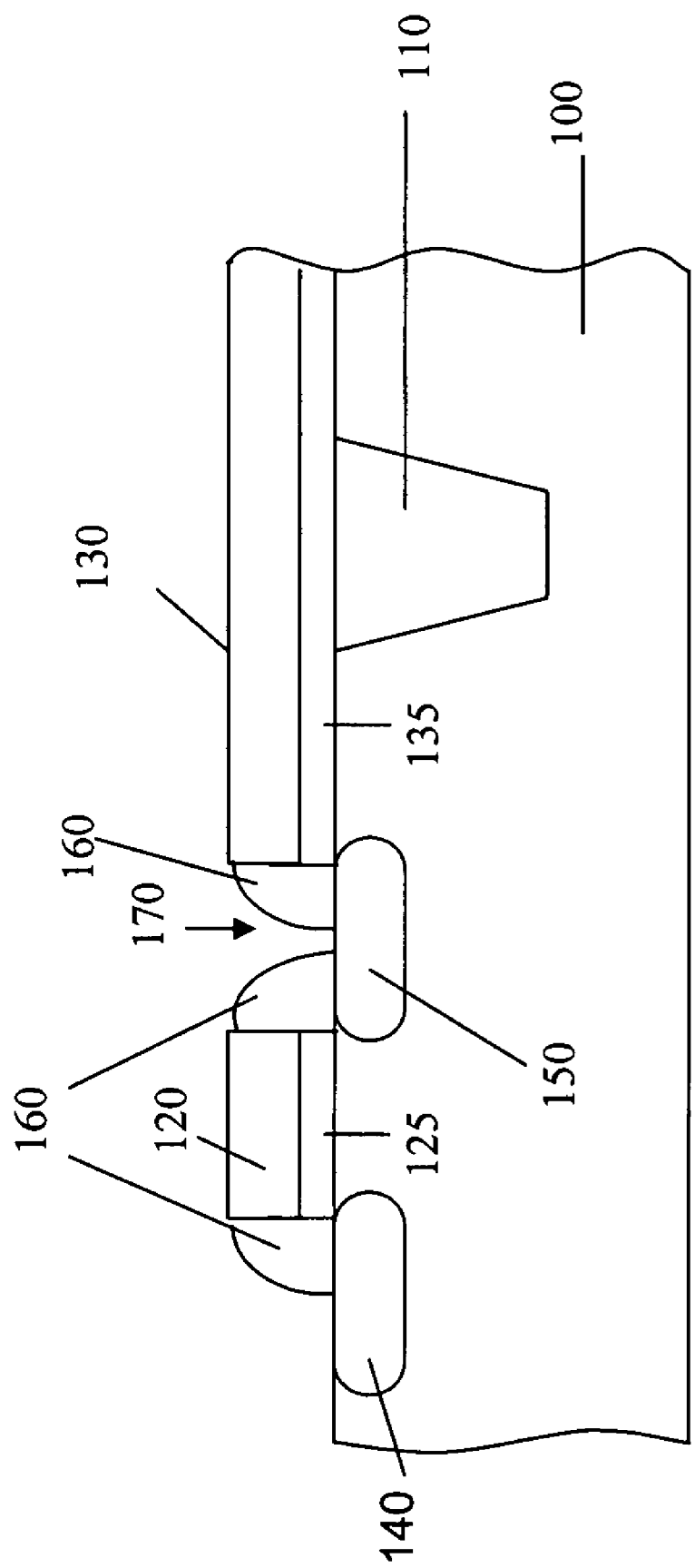
FIG. 1 illustrates a partial cross-sectional view of a prior art one-transistor cell.
Figure 2C:
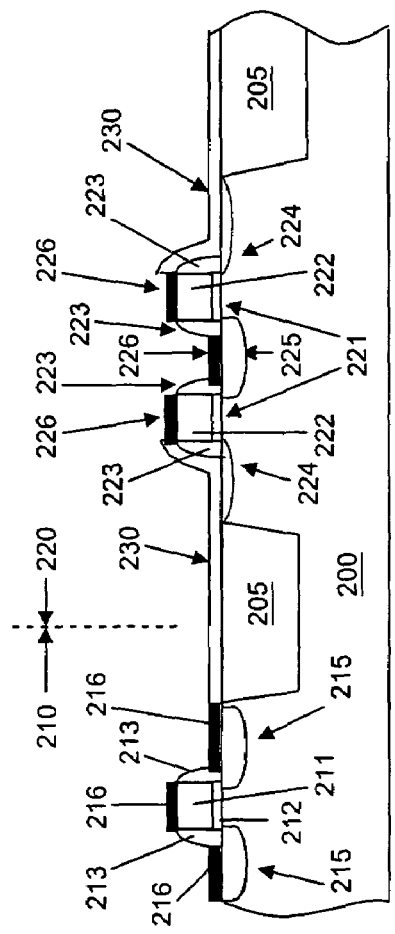

FIGS. 2A–2G are a series of cross-sectional views illustrating an exemplary embodiment of a method of forming a one-transistor cell. FIG. 2A shows a substrate 200 having a periphery circuit region 210, a cell region 220 and isolation regions 205 therein. The periphery circuit region 210 has a periphery gate dielectric layer 211 and a periphery gate 212 formed on the substrate 200. The cell region 220 has a pass-gate dielectric layers 221 and pass-gates 222 formed on the substrate 200.

The substrate 200 is preferably a substrate adapted to form integrated circuits thereon. The substrate 200 can be, for example, a silicon substrate, silicon-germanium substrate, silicon-on-insulator (SOI) substrate, III-V compound substrate, or any other substrate that can substantially perform the same function of the substrate 200. The isolation regions 205 are formed to isolate different devices within semiconductor integrated circuits formed upon the substrate 200. Usually, well regions (not shown) are also formed within the substrate 200. The well regions can be a N-type or P-type well depending on the dopant used in the well. For example, a N-type well containing one of group V elements, such as phosphorus or arsenic, can be formed by, for example, implantation; a P-type well containing one of group III elements, such as boron or gallium, can be formed within the substrate by, for example, implantation. The isolation regions 205 can be formed by shallow trench isolation (STI) or local oxidation of silicon (LOCOS). In the embodiment shown in FIG. 2A, the isolation regions 205 are STI regions.

The periphery gate dielectric layer 211 and the pass-gate dielectric layer 221 isolate the periphery gate 212 and the pass-gates 222 from the substrate 200 and couple the voltage of the periphery gate 212 and the pass-gates 222 to the substrate 200. The periphery gate dielectric layer 211 and the pass-gate dielectric layer 221 can be, for example, a silicon oxide layer, a silicon oxynitride layer, a silicon nitride layer, high dielectric constant layer, or any other material that can substantially perform the same function of the pass-gate dielectric layer 221 and the periphery gate dielectric layer 211. The periphery gate 212 and the pass-gates 222 are adapted to control the transistors formed thereby. The periphery gate 212 and the pass-gates 222 can be, for example, polysilicon, WSi, metal or the like, and formed by, for example, a chemical vapor deposition (CVD) or physical vapor deposition (PVD) process. In the embodiment shown in FIG. 2A, the periphery gate 212 and the pass-gates 222 are polysilicon. There is no requirement that the periphery gate dielectric layer 211 and the pass-gate dielectric 221, or the periphery gate 212 and the pass-gates 222 be formed in the same process step or made of same material. In some embodiments, in order to simplify the fabrication process, the periphery gate dielectric layer 211 and the pass-gate dielectric 221, and/or the periphery gate 212 and the pass-gates 222, are formed in the same process step.

FIG. 2B illustrates that spacers 213 and 223 are formed on the sidewalls of the periphery gate 212 and pass-gates 222, respectively. Source/drain (S/D) regions 215 of the periphery circuit region 210 are formed within substrate 200. A S/D regions 215 of the periphery circuit region 210 are formed within the substrate 200 and adjacent to the periphery gate 212. The S/D region 225 and doped regions 224 of the cell region 220 are formed therein. The S/D region 225 is formed within the substrate 200 and adjacent to and between the pass-gates 222. The doped regions 224 are formed within the substrate 200 and adjacent to the pass-gates 222.

The spacers 213 and 223 can be, for example, silicon oxide, silicon oxynitride, or silicon nitride, and be formed by CVD or PVD. The S/D regions 215 and 225 may be a N-type or P-type dopant region. Phosphorus, arsenic or any other group V element can be the N-type dopant source implanted into the substrate 200. Boron, gallium or any other group III element can be the P-type dopant source implanted into the substrate 200. The doped regions 224 can also be a N-type or P-type doped region. In one embodiment, the doped regions 224 are formed by a lightly doped drain (LDD) process. In this embodiment shown in FIG. 2B, the S/D regions 215 and 225 and the doped regions 224 have different dopant concentrations and depths. The doped regions 224 have a dopant concentration lower than that of the S/D region 225. There is no requirement that the S/D regions 215 and 225 be formed in the same process step. In some embodiments, in order to simplify the fabrication process the S/D regions 215 and 225 are formed in the same process.

FIG. 2C illustrates an exemplary structure having a resistance protection oxide (RPO) layer 230 and salicide regions 216 and 226 formed on the structure of FIG. 2B. After the structure as shown in FIG. 2B is formed, the resistance protection oxide (RPO) layer 230 is formed thereon. The RPO layer 230 protects the substrate from the subsequent salicidation process. The RPO layer 230 is usually an oxide layer. Other materials, such as silicon oxynitride, silicon nitride or any other material that can substantially perform the same function of the RPO layer 230 can replace the RPO layer 230. The RPO layer 230 can be formed by, for example, CVD or PVD. A photolithographic process (not shown) is employed to define and expose the regions that are going to be salicided, and an etching process (not shown) removes the exposed portions of RPO layer 230. A salicide process is then performed to form the salicide regions 216 and 226. The salicide can be, for example, cobalt salicide, titanium salicide, tantalum salicide, nickel salicide or the mixture thereof. The salicide process includes the steps of, for example, depositing a metal layer, such as cobalt, titanium, tantalum, nickel or the mixture thereof and annealing the metal layer and the substrate to form the salicide layer in exposed silicon areas There is no requirement that the salicide regions 216 and 226 be formed in the same salicide process. In order to simplify the fabrication process, the salicide regions 216 and 226 may be formed in the same salicide process.

Figure 2D:
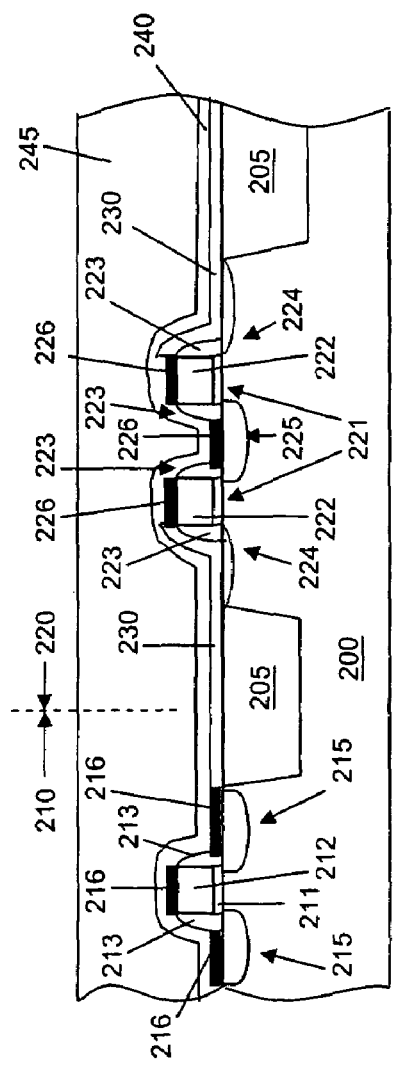

FIG. 2D illustrates an exemplary structure showing that an etch stop layer 240 and a dielectric layer 245 are formed over the structure of FIG. 2C. The etch stop layer 240 is first formed on the structure shown in FIG. 2C. The etch stop layer 240 serves as an etch stop layer for a subsequent etching process, such as in contact formation. The etch stop layer 240 can be, for example, silicon oxide, silicon nitride, silicon oxynitride or any other material that can substantially perform the same function of the etching stop layer 240, and can be formed, for example, by CVD. There is no requirement, however, that the etch stop layer 240 be present in the manufacturing process. It may be readily understood that the presence of the etching stop layer 240 depends on the requirements of different semiconductor manufacturing technologies.

The dielectric layer 245 is then formed over the etch stop layer 240. The dielectric 245 can be, for example, silicon oxide, silicon oxynitride, silicon nitride or low dielectric constant material and be formed, for example, by CVD. In an exemplary embodiment shown in FIG. 2D, the dielectric layer 245 is made of silicon oxide and has a thickness from about 2000 Å to about 7000 Å. It may be readily understood that the thickness of the dielectric layer 245 depends on the requirements of different semiconductor manufacturing technologies. In some embodiments, a chemical-mechanical polish (CMP) process or an etch-back process is performed to planarize the dielectric layer 245 after deposition. However, the CMP or etch-back process is not required. For example, the topography of the structure of FIG. 2D may not effect the following photographic or etching processes if left unplanarized.

Figure 2E:
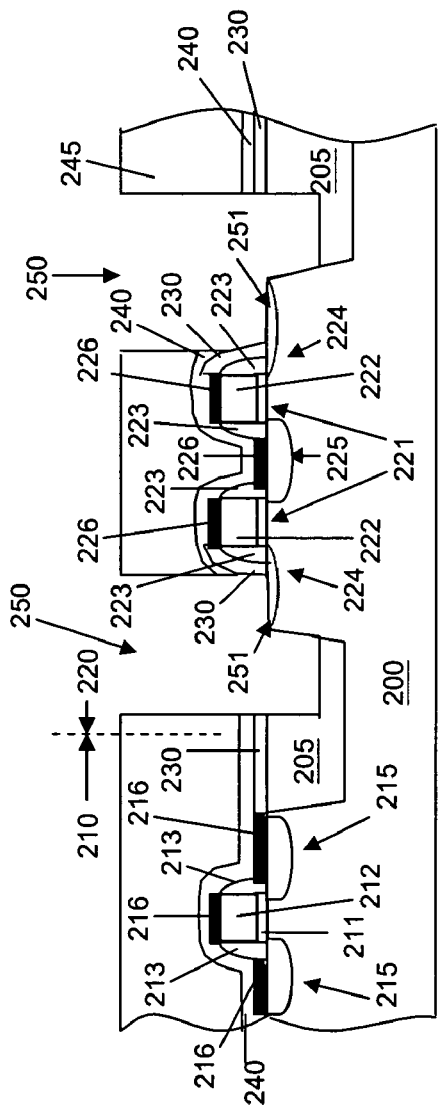

FIG. 2E illustrates that openings 250 are next formed in the dielectric layer 245 to expose portions of substrate 251 and, in one embodiment, to remove portions of the isolation regions 205. Portions of the substrate are exposed at least adjacent to the pass-gates 222. In some embodiments, the substrate is exposed in the area proximate to the etch stop layer 240, the RPO layer 230 (as shown in FIG. 2E), or the spacers 223 formed along the sidewalls of the pass-gates 222.

A photoresist layer (not shown) is first formed over the structure of FIG. 2D. A photolithographic process then forms openings defining the regions in which capacitors will be formed. An etch process then removes exposed portions of the dielectric layer 245. When the dielectric layer 245 comprises silicon oxide, the etching process can use $CF_4$, $CHF_3$, $C_2F_6$, $C_3F_8$, $C_4F_8$ or a mixture thereof as an etch gas for removal of the dielectric layer 245. In the embodiment shown in FIG. 2E, the etch process is selected to further remove portions of the isolation regions 205 and to form recesses therein. In some embodiments, the etch process uses a dielectric layer on the sidewall of the pass-gates 222, such as the spacers 223, the RPO layer 230, the etch stop layer 240 or the combination thereof, as an etch stop layer during formation of the openings 250. The dielectric layer on the sidewalls of the pass-gates 222, e.g., RPO layer 230, etch stop layer 240, or spacers 223, is exposed in the openings 250. In some embodiments, the space between the pass-gates 222 and the exposed portions of substrate 251 is from about 400 Å to about 1500 Å. After the etch process, the photoresist layer is removed.

Figure 2F:
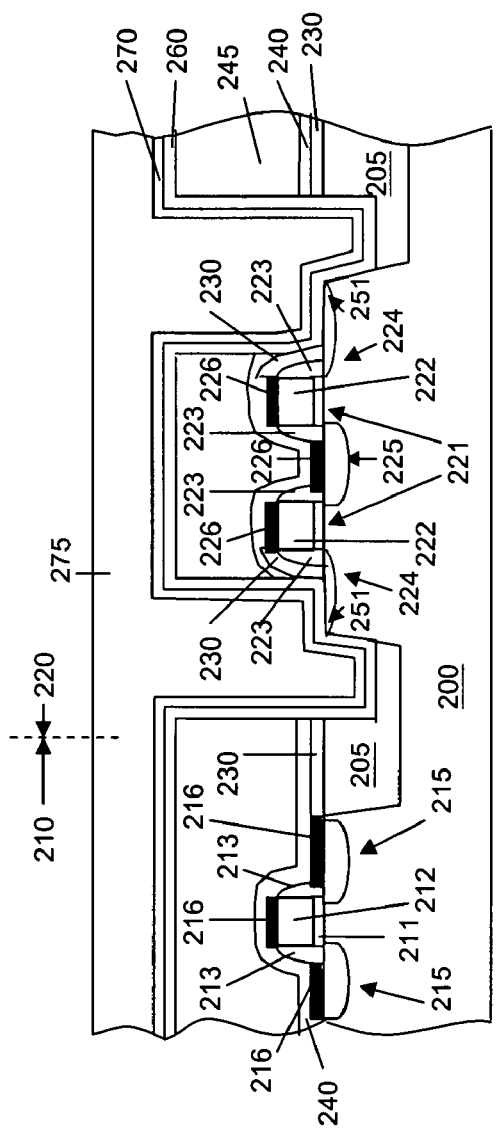

FIG. 2F illustrates an exemplary DRAM one-transistor structure including a capacitor dielectric layer 260, an electrode layer 270 and a planarization layer 275 formed over the structure of FIG. 2E. The capacitor dielectric layer 260 is conformally formed over the structure of FIG. 2E, including the sidewalls of the openings 250 and on the portions of exposed substrate 251 and isolation regions 205. In the embodiment shown in FIG. 2F, the capacitor dielectric layer 260 and the electrode layer 270 are formed partially within the recesses formed within the isolation regions 205. The capacitor dielectric layer 260 can be, for example, a high dielectric constant material, such as $Ta_2O_5$, $Al_2O_3$, $HfO_2$, $SrTiO_3$, $ZrO_2$ or the like, silicon nitride, silicon oxynitride, silicon oxide or any other material that is adapted to be the capacitor dielectric layer 260, and can be formed by CVD, PVD or atomic layer deposition (ALD).

The electrode layer 270 is formed on the capacitor dielectric layer 260. The electrode layer 270 is a conductive material, such as a material including metal, e.g., Al, Al—Cu, TiN, TaN, Ru or the like, or polysilicon, WSi or the similar material that can serve as an electrode layer 270. In one embodiment, capacitor dielectric layer 260 includes a high-k material with a metal electrode layer 270 conformally deposited thereon by ALD. It is believed that atomic layer deposition of a high-k material provides substantially conformal coverage of the dielectric layer, including within the openings 250 and along the exposed substrate portions 251.

The planarization layer 275 can be, for example, a dielectric layer, such as silicon oxide, a photoresist layer or any other material that can serve to planarize the structure of FIG. 2F. The planarization layer 275 is deposited over the electrode layer 270 and fills the openings 250. The layer is then polished or etched back to planarize the structure for subsequent processing, such as contact formation.

Figure 2G:
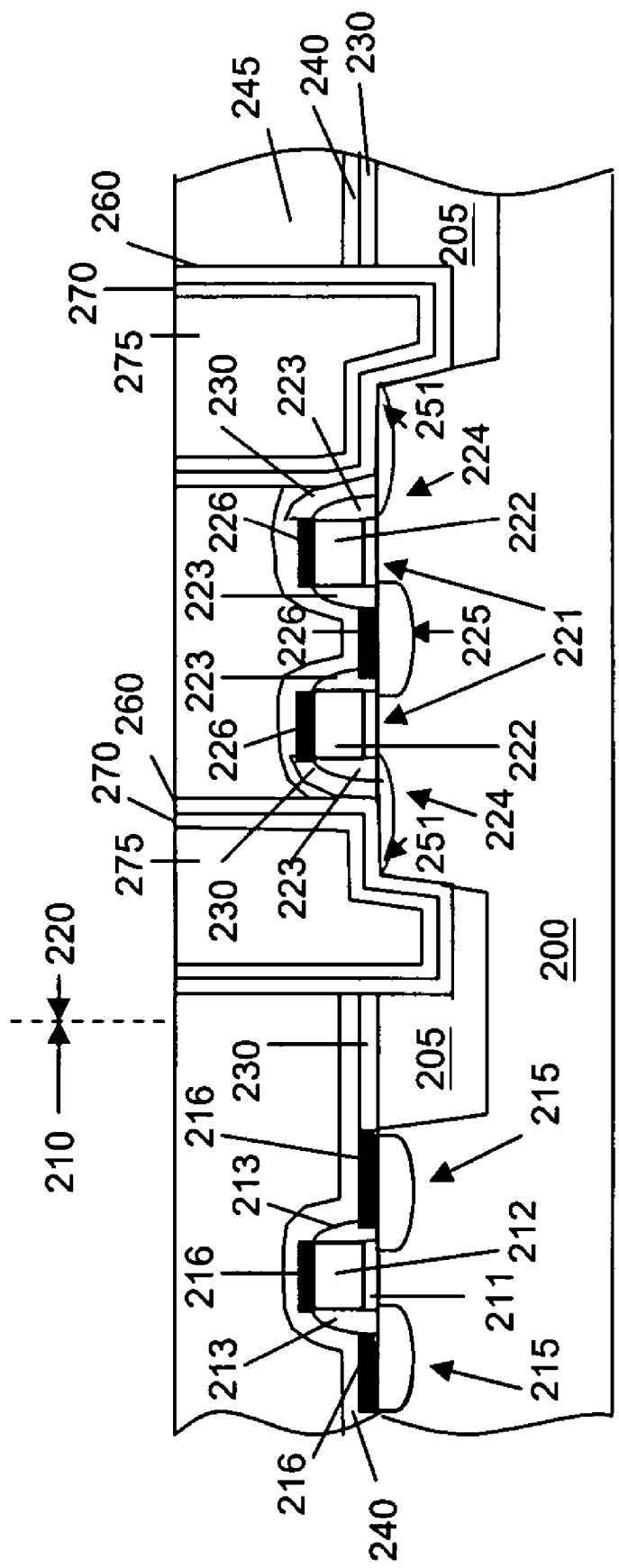

FIG. 2G illustrates an exemplary structure showing that portions of planarization layer 275, and horizontal portions of the capacitor dielectric layer 260 and the electrode layer 270 formed over dielectric layer 245 are removed. Accordingly, the capacitor dielectric layer 260 is formed on the sidewalls of the dielectric layer 245 and isolation region 205 and on the portions of exposed substrate 251 and the isolation region 205. The remaining electrode layer 270 remains on the remaining portions of the capacitor dielectric layer 260.

From FIG. 2F, an etch-back process or a CMP process can be employed to remove the portions of planarization layer 275, the capacitor dielectric layer 260 and the electrode layer 270 directly over the remaining dielectric layer 245, and to planarize the surface of the structure of FIG. 2F. Oxide CMP, metal CMP or the combination thereof can be employed. In embodiments using a photoresist as the planarization layer 275, after the surface of the structure of FIG. 2G is planarized, the photoresist within the openings 250 is removed.

Subsequent dielectric deposition, contact formation and metal layer formation processes are then performed to connect the one-transistor cell with the periphery circuits. These processes can be performed by traditional backend processes for fabrication of semiconductor integrated circuits and should familiar to those skilled in integrated circuit fabrication.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of forming a one-transistor memory cell, comprising:
   (a) forming a dielectric layer over a substrate having a pass-gate formed thereon;
   (b) forming an opening in the dielectric layer to expose a portion of the substrate at least adjacent to the pass-gate;
   (c) forming a capacitor dielectric layer on sidewalls of the opening in the dielectric layer and directly on the exposed portion of the substrate; and
   (d) forming an electrode layer over the capacitor dielectric layer.

2. The method of claim 1, wherein step (b) further comprises the steps of forming a recess in an isolation region within the substrate, and steps (c) and (d) further comprise forming the capacitor dielectric layer and the electrode layer within the recess of the isolation region.

3. The method of claim 1, wherein steps (c) and (d) comprise:
   after step (b), substantially conformally forming the capacitor dielectric layer over the dielectric layer;
   forming a planarization layer over the electrode layer; and
   removing portions of the planarization layer, the capacitor dielectric layer and the electrode layer directly over the dielectric layer.

4. The method of claim 3, wherein the planarization layer is a dielectric layer.

5. The method of claim 3, wherein the planarization layer is a photoresist layer.

6. The method of claim 5, wherein a portion of said photoresist layer remains in the opening of said dielectric layer after said removing step, the method further comprising the step of removing the portion of said photoresist layer within the opening of the dielectric layer.

7. The method of claim 1, wherein step (b) further comprises using a second dielectric layer formed on a sidewall of the pass-gate as an etching stop layer.

8. The method of claim 1, wherein a space between the pass-gate and the exposed portion of the substrate is from about 400 Å to about 1500 Å.

9. The method of claim 1, wherein the capacitor dielectric layer comprises a high dielectric constant material layer.

10. The method of claim 9, wherein the electrode layer comprises a metal layer.

11. The method of claim 1 further comprising:
    (e) forming a source/drain (S/D) region within the substrate and adjacent to the pass-gate; and
    (f) forming a doped region within the substrate and adjacent to the pass-gate and the electrode layer.

12. The method of claim 11, wherein the doped region has a dopant concentration lower than that of the S/D region.

13. A method of forming a one-transistor memory cell, comprising:
    forming a dielectric layer over a substrate having a pass-gate formed thereon;
    forming an opening in the dielectric layer to expose a portion of the substrate at least adjacent to the pass-gate;
    forming a capacitor dielectric layer comprising a high dielectric constant material layer by atomic layer deposition (ALD) on sidewalls of the opening in the dielectric layer and directly on the exposed portion of the substrate; and forming an electrode layer over the capacitor dielectric layer.

14. A method of forming a one-transistor memory cell, comprising:
(a) forming an isolation region within a substrate, a pass-gate over the substrate and a first dielectric layer over the substrate including over the isolation region and the pass-gate;
(b) forming an opening through the first dielectric layer to expose a portion of the substrate at least adjacent to the pass-gate, wherein a second dielectric layer on a sidewall of the pass-gate is used as an etch stop layer, and a recess within the isolation region;
(c) forming a capacitor dielectric layer on sidewalls of the opening in the first dielectric layer, at least partially within the recess of the isolation region and on the exposed portion of the substrate;
(d) forming an electrode layer over the capacitor dielectric layer;
(e) forming a source/drain (S/D) region within the substrate and adjacent to the pass-gate; and
(f) forming a doped region within the substrate and adjacent to the pass-gate and the electrode layer.

15. The method of claim 14, wherein the steps (c) and (d) comprise:
after step (b), substantially conformally forming the capacitor dielectric layer over the first dielectric layer;
forming a planarization layer over the electrode layer; and
removing portions of the planarization layer, the capacitor dielectric layer and the electrode layer directly over the first dielectric layer.

16. The method of claim 15, wherein the planarization layer is a dielectric layer.

17. The method of claim 15, wherein the planarization layer is a photoresist layer.

18. The method of claim 17 further comprising the step of removing the photoresist layer within the opening of the first dielectric layer after the removing portions step.

19. The method of claim 14, wherein a space between the pass-gate and the exposed portion of the substrate is from about 400 Å to about 1500 Å.

20. The method of claim 14, wherein the capacitor dielectric layer comprises a high dielectric constant material layer.

21. The method of claim 20, wherein the capacitor dielectric layer is formed by atomic layer deposition (ALD).

22. The method of claim 20, wherein the electrode layer comprises a metal layer.

23. The method of claim 14, wherein the doped region has a dopant concentration lower than that of the S/D region.

24. A method of forming a one-transistor memory cell, comprising:
(a) forming a dielectric layer over a substrate having a pass gate formed thereon;
(b) forming an opening in the dielectric layer to expose at least a portion of the substrate adjacent to the pass-gate;
(c) conformally forming a capacitor dielectric layer on sidewalls of the opening in the dielectric layer and directly on the exposed portion of the substrate; and
(d) conformally forming an electrode layer over the capacitor dielectric layer along sidewalls of the opening in the dielectric layer and over the exposed portion of the substrate, leaving a remaining portion of said opening.

25. The method of claim 24, wherein step (b) further comprises the steps of forming a recess in an isolation region within the substrate, and steps (c) and (d) further comprise forming the capacitor dielectric layer and the electrode layer along walls of the recess of the isolation region.

26. The method of claim 24,
wherein portions of the capacitor dielectric layer and electrode layer are formed over a top surface of said dielectric layer, the method further comprising:
forming a planarization layer over the electrode layer and in the remaining portion of said opening; and
removing portions of the planarization layer, the capacitor dielectric layer and the electrode layer over the top surface of said dielectric layer.

27. The method of claim 26, wherein the planarization layer is a dielectric layer.

28. The method of claim 26, wherein the planarization layer is a photoresist layer.

29. The method of claim 28, further comprising the step of removing the photoresist layer within the opening of the dielectric layer after the removing portions step.

30. The method of claim 26, wherein said removing step comprises a CMP process.

31. The method of claim 24, wherein step (b) further comprises using a second dielectric layer formed on a sidewall of the pass-gate as an etching stop layer.

32. The method of claim 24, wherein a space between the pass-gate and the exposed portion of the substrate is from about 400 Å to about 1500 Å.

33. The method of claim 24, wherein the capacitor dielectric layer comprises a high dielectric constant material layer.

34. The method of claim 33, wherein the capacitor dielectric layer is formed by atomic layer deposition (ALD).

35. A method of forming a one-transistor memory cell, comprising;
forming a dielectric layer over a substrate having a pass gate formed thereon;
forming an opening in the dielectric layer to expose at least a portion of the substrate adjacent to the pass-gate;
conformally forming a capacitor dielectric layer comprising a high dielectric constant dielectric layer by atomic layer deposition (ALD) on sidewalls of the opening in the dielectric layer and directly on the exposed portion of the substrate; and
conformally forming an electrode layer comprising a metal layer over the capacitor dielectric layer along sidewalls of the opening in the dielectric layer and over the exposed portion of the substrate, leaving a remaining portion of said opening.

36. The method of claim 24 further comprising:
(e) forming a source/drain (S/D) region within the substrate and adjacent to the pass-gate; and
(f) forming a doped region within the substrate and adjacent to the pass-gate and the electrode layer.

37. The method of claim 36, wherein the doped region has a dopant concentration lower than that of the S/D region.

* * * * *